(12) United States Patent
Bausch et al.

(10) Patent No.: US 6,191,546 B1
(45) Date of Patent: Feb. 20, 2001

(54) PROPORTIONAL INTEGRAL COOLING DEVICE CONTROLLER FOR ELECTRONIC DEVICE

(75) Inventors: James F. Bausch, Salem; Andrew L Van Brocklin, Corvallis; Chadwick W Stryker, Albany, all of OR (US)

(73) Assignee: Hewlett-Packard Company, Palo Alto, CA (US)

( * ) Notice: Under 35 U.S.C. 154(b), the term of this patent shall be extended for 0 days.

(21) Appl. No.: 09/411,361

(22) Filed: Oct. 1, 1999

Related U.S. Application Data

(63) Continuation-in-part of application No. 09/295,661, filed on Apr. 21, 1999, now Pat. No. 6,011,371, which is a continuation of application No. 08/955,478, filed on Oct. 22, 1997, now Pat. No. 5,929,581.

(51) Int. Cl.[7] .............................. H02P 7/00; G05D 23/20
(52) U.S. Cl. .......................... 318/471; 318/452; 318/484; 388/921; 388/934
(58) Field of Search ..................................... 318/268, 272, 318/456, 461, 471, 621, 620, 445, 449, 452, 484, 473, 53, 59, 66, 112; 388/907.5, 934, 921

(56) References Cited

U.S. PATENT DOCUMENTS

| | | | |
|---|---|---|---|
| 3,794,896 | 2/1974 | Holt | 318/471 |
| 4,168,456 | 9/1979 | Isobe | 318/471 |
| 4,276,506 | 6/1981 | Little | 318/806 |
| 4,297,851 | 11/1981 | Paddock et al. | 62/126 |
| 4,506,199 | 3/1985 | Asche | 318/313 |
| 4,696,167 * | 9/1987 | Matsui et al. | 62/180 |
| 5,099,181 | 3/1992 | Canon | 318/254 |
| 5,197,858 | 3/1993 | Cheng | 417/14 |
| 5,457,766 | 10/1995 | Ko | 388/831 |
| 5,460,009 | 10/1995 | Wills et al. | 62/180 |
| 5,825,972 | 10/1998 | Brown | 388/811 |

* cited by examiner

Primary Examiner—Bentsu Ro
(74) Attorney, Agent, or Firm—Timothy F. Myers (57) ABSTRACT

An electronic device has a heat producing component thermally coupled to a heat dissipation structure. The electronic device further has control circuitry connected to a temperature sensor that senses the component temperature of the heat producing component. The control circuit is further connected to a cooling device also thermally coupled to the heat dissipation structure. The control circuit varies the cooling rate in a manner that cancels out a lag time which occurs during a change from a steady state condition of the component temperature. The cooling rate of the cooling device is varied by the control circuit in proportion to variation in sensed component temperature from the temperature sensor.

20 Claims, 9 Drawing Sheets

PROPORTIONAL INTEGRAL COOLING DEVICE CONTROLLER FOR ELECTRONIC DEVICE

CROSS REFERENCES TO CO-PENDING APPLICATION

This application is a continuation-in-part of commonly assigned application Ser. No. 09/295,661, filed Apr. 21, 1999, now U.S. Pat. No. 6,011,371, which in turn is a continuation of commonly assigned application Ser. No. 08/955,478, filed Oct. 22, 1997, now U.S. Pat. No. 5,929,581.

FIELD OF THE INVENTION

This invention relates to temperature control in electronic devices, and more particularly to method and apparatus for controlling a variety of cooling devices to regulate the temperature of heat producing components.

BACKGROUND OF THE INVENTION

Conventional electronic devices typically had to address only a single heat source such as a microprocessor or processor module. While microprocessors or processor modules continue to increase in power consumption, the associated support circuitry is also increasing in power consumption. This increase is due to the need to keep up with the higher operating speeds and performance of the microprocessors. Additionally, support devices such as batteries are required to discharge and charge in limited temperature ranges in order to meet regulatory safety requirements. Ignoring the additional heating from these other sources can lead to catastrophic failures. Thus a need exists to simultaneously monitor multiple heat producing components.

Traditional temperature control devices monitored the temperature on a large thermal mass such as a heat sink attached to an integrated circuit (IC), such as a microprocessor or module, or even just the ambient air within a cavity of an electronic device. Due to the low thermal drop across the IC-heat sink interface, the heat sink monitoring was a sufficient indication of actual IC die temperature. With the advent of higher power devices such as Pentium III processors and 3D enabled graphic controllers, which operate at different power levels depending on the actual use, the drop across the IC-heat sink interface varies. A further concern is that due to higher levels of integration, more power is being expended in a smaller die or module area. Additionally, due to the need to support different optional configurations for a postponement manufacturing process, the thermal IC-heat sink interface may not be predictable. To ensure that the IC does not exceed its thermal design specifications, manufacturers of the ICs have begun to incorporate thermal diodes onto the IC die which allow external circuitry to monitor the forward voltage drop of the diode, thus providing an indication of die temperature. However, when the temperature is monitored on the die, there is little feedback on how the heat being dissipated from the heat sink or other heat dissipation structure is affecting other devices within the electronic device or the external surfaces of the electronic device. Therefore, a need exists to more accurately monitor individual die or module temperatures while also providing system wide thermal control.

Several different temperature sensors have been developed to measure the temperature of electronic devices and thermal surfaces. Traditionally, thermistors with either positive or negative thermal coefficients were used typically with bridge circuits to provide a difference signal that gave an indication of relative temperature change. As previously stated, the need to monitor die temperature directly has required that IC manufacturers develop diode temperature sensors which allow for easy fabrication using conventional IC processes. Since the forward voltage drop of the diode is non-linear with temperature, the diode temperature sensor is typically accompanied by a companion IC which provides an analog-to-digital conversion of the diode voltage drop and the accompanying non-linear to linear conversion. Thus, the output of the diode temperature sensor is a digital output and cannot be directly incorporated into conventional analog controller circuits. Therefore, a need exists to have a temperature control circuit which can support multiple types of temperature sensors.

SUMMARY

An electronic device has a heat producing component thermally coupled to a heat dissipation structure. The electronic device further has control circuitry connected to a temperature sensor that senses the component temperature of the heat producing component. The control circuit is further connected to a cooling device also thermally coupled to the heat dissipation structure. The control circuit varies the cooling rate in a manner that cancels out a lag time which occurs during a change from a steady state condition of the component temperature. The cooling rate of the cooling device is varied by the control circuit in proportion to variation in sensed component temperature from the temperature sensor.

DETAILED DESCRIPTION OF THE PREFERRED AND ALTERNATE EMBODIMENTS

The invention expands upon the concept of the proportional integral fan controller for electronic devices of commonly assigned U.S. Pat. No. 6,011,371 and hereby incorporated by reference within, to address a multitude of problems being addressed by system designers of electronic devices.

One aspect of the invention is to allow for more accurate control of individual temperatures of heat producing components such as integrated circuits, batteries, and electronic devices, in particular, microprocessors, than conventional techniques provide to increase reliability and prevent catastrophic failures. Another aspect of the invention is to allow for the interchange of various electronic modules, such as processor modules and graphic controller modules, having different thermal characteristics, such as thermal lag reaction time, to support the postponement manufacturing processes used in today's manufacturing of electronic devices. A further aspect of the invention is to allow for the support of different thermal measurement devices such as on-die diodes incorporated with digital temperature sensors. One aspect of the invention is to address thermal management of multiple heat sources in an electronic device. Several aspects of the invention are directed to reducing acoustical noise. Yet another aspect of the invention is to support multiple types of cooling devices through the use of adaptive filtering. In addition, an aspect of the invention is to support multiple modes of operation such as stand-alone mobile use and integration of the notebook into a company's enterprise network with the use of a docking station for the notebook.

Figure 1:
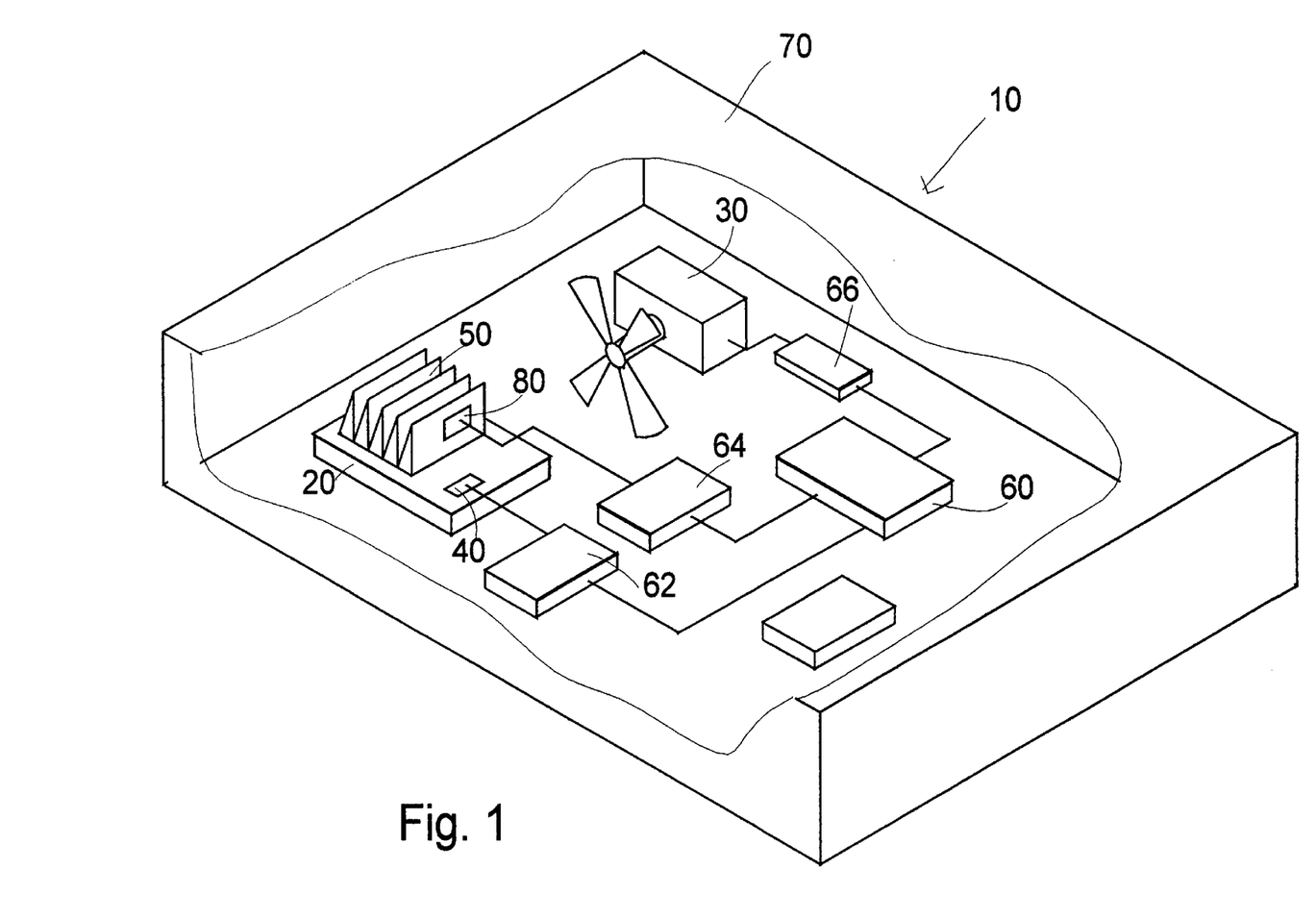
FIG. 1 is an illustration of an electronic device which incorporates the invention.

FIG. 1 is an isometric drawing illustrating an electronic device 10 having a heat producing component 20, a cooling device 30, a temperature sensor 40 connected to the heat producing component 20, and a heat dissipation structure 50 thermally coupled to heat producing component 20. The heat producing component 20 has a component temperature measured by temperature sensor 40. Temperature sensor 40 is further connected to a first digital temperature sensor interface 62. The heat dissipation structure 50 has an additional temperature sensor 80 connected to it and further connected to a second digital temperature sensor interface 64. Both the first and second digital temperature sensors interfaces 62, 64 are connected to control circuitry 60. The cooling device 30 has a cooling rate and a rate of change of cooling rate that is varied by the control circuitry 60. The heat dissipation structure 50 is also thermally coupled to the cooling device 30. However, the heat dissipation structure 50 has a thermal mass which causes the component temperature of the heat producing component 20 to exhibit a lag time in response from the rate of change of the cooling rate of the cooling device 30. Control circuitry 60 implements closed loop control over the cooling device 30 in order to vary the cooling rate in a manner which cancels out this lag time during a change from a steady state condition of the temperature of the heat producing component 20 during a change from a steady state condition of the component temperature. Further, the control circuitry 60 varies the cooling rate of the cooling device 30 in proportion to variation in sensed component temperature during a steady state condition of the component temperature. Buffer 66 provides the digital to analog interface between the control circuitry 60 and the cooling device 30.

While the second temperature sensor 80 is shown attached to the heat dissipation structure 50, it is also envisioned that a second temperature sensor 80 is optional and if present it is able to be used to sense any other desired local environment temperature that is affected by the thermal radiation from the heat dissipation structure 50 and the cooling device 30 and still meet the spirit and scope of the invention. The control circuitry incorporates the readings from the first temperature sensor 40 and preferably the second temperature sensor 80 into implementation of the closed loop control. One method of incorporating the second temperature sensor 80 reading is to use the reading as a reference temperature which is subtracted from the reading from the first temperature sensor 40. This method is used to allow the cooling device to minimize the thermal gradient between the position of the heat producing component 40 and the location of the second temperature sensor 80 at the desired local environment temperature. Another method of incorporating the second temperature sensor 80 is to use the reading from it to alert the system that a predetermined threshold has been reached or exceeded and enabling an additional cooling device 32 (see FIG. 2) that is thermally coupled to the heat producing component 20. This second cooling device is preferably also proportionally controlled by the control circuitry 60 but could also just be controlled in a full on/off fashion.

Although heat sinks are the preferred heat dissipation structure to implement, size, weight, cost, and useable packaging constraints have lead to the use of other heat dissipation structures such as heat pipes, heat spreaders, remote heat exchangers, and combinations of the aforementioned. Further, modifications to heat sinks, such as the addition of venturi vents (see commonly assigned U.S. patent application Ser. No. 09/181,720, hereby incorporated by reference within), have increased their heat dissipation efficiency when used with air moving devices such as fans and blowers.

The increasing power dissipation of electronic devices such as notebook computers has spawned research and development of several different types of cooling devices in addition to efficiency increases in conventional cooling devices such as fans and blowers. Some of the new cooling devices include adjustable flow or multi-mode heat pipes (see commonly assigned U.S. Pat. No. 6,047,766, hereby incorporated by reference within), compressed gas cartridges with adjustable flow (see commonly assigned U.S. patent application Ser. No. 09/181,720), and circuitry which adjusts the frequency of the system clock to an IC. Each of these new cooling devices exhibits a differing lag time in response to a change in the rate of the cooling rate of the cooling device.

Figure 2:
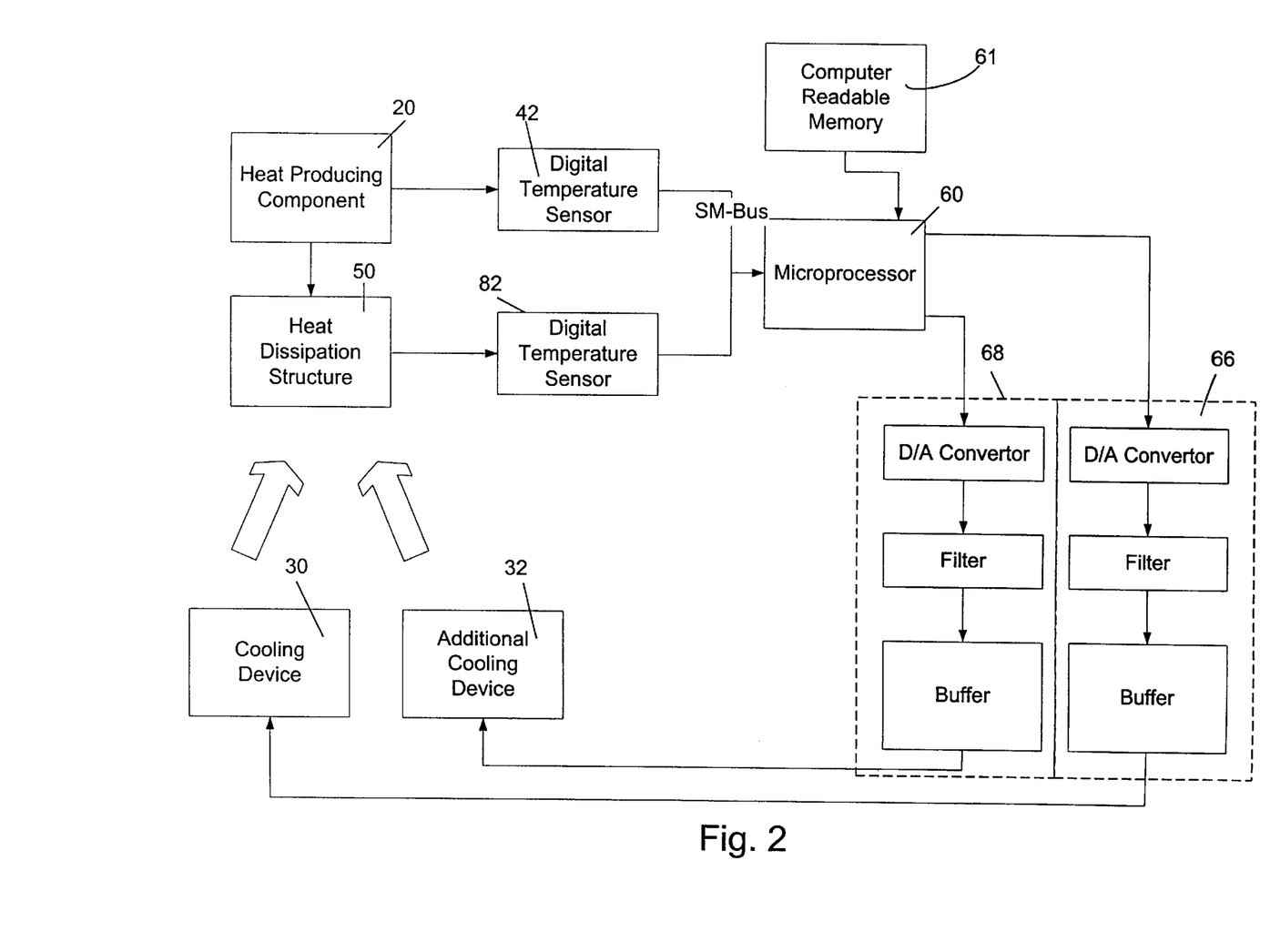
FIG. 2 is a block diagram of an exemplary embodiment of the invention.

FIG. 2 is a block diagram of an embodiment of the invention that illustrates an implementation of a multiple cooling device architecture. Heat producing component 20 generates heat that is thermally coupled to a heat dissipation structure 50. First digital temperature sensor 42 senses the temperature from heat producing component 20 and is read using a conventional SMBus (system management bus) or equivalent interface by control circuitry 60, which is implemented as a digital microprocessor, such as power management and keyboard controllers like a National PC 87570 microcontroller or Hitachi H8 microcontroller, to name a couple. First digital temperature sensor 42 is preferably a Maxim 1617A or equivalent coupled to an on-die diode on heat producing component 20. Second digital temperature sensor 82 is similar to first digital temperature sensor 84 except second digital temperature sensor 82 preferably uses a discrete thermal sensing diode such as the base-emitter junction of a 2N3904 transistor. Second digital temperature sensor 82 senses the temperature of heat dissipation structure 50 and is also read by control circuitry 60 using the SMBus. Control circuitry 60 has a software subroutine loaded in computer readable memory 61 which implements the proportional integral cooling device control. The temperature readings are processed by the software subroutine and the resultant value is sent by the control circuitry 60 to a first buffer 66 to control the cooling device 30. First buffer 66 performs the digital to analog conversion, preferably also quantization noise filtering and current buffering as required to drive the cooling device 30. Preferably, the digital to analog conversion and quantization noise filtering are incorporated into the microprocessor of control circuitry 60. A second buffer 88 interfaces the control circuitry 60 with the additional cooling device 32. The second buffer 68 also performs digital to analog conversion, preferably quantization noise filtering and current buffering. However, if the additional cooling device 32 is implemented as an on/off device, the second buffer 68 may be just a simple current buffer or direct drive from the control circuitry 60.

Figure 3A:
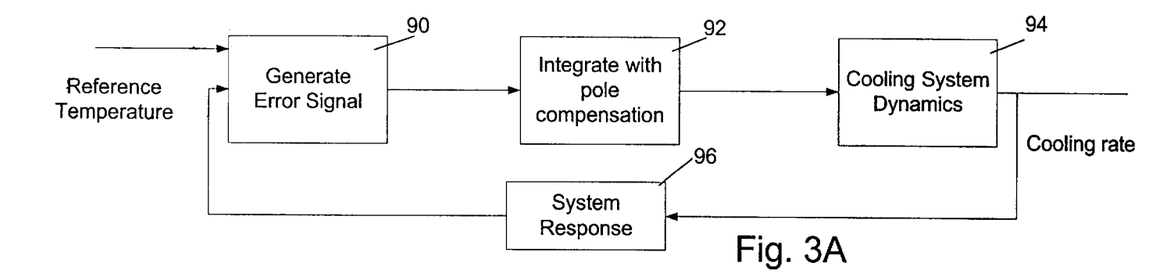
FIG. 3A is a system control diagram in the s-domain of the exemplary embodiment of FIG. 2.

FIG. 3A illustrates a control diagram the block diagram of the system of FIG. 2. In block 90, an error signal is generated by subtracting the system response, e.g. the component temperature, from a reference temperature. The difference is represented by a change in voltage per degree Celsius in temperature. In an exemplary embodiment, this factor is 50 mv/degree C. The reference temperature may be a fixed temperature limit or it may be preferably the local environment temperature read by second digital temperature sensor 82. The error signal is integrated with pole compensation in block 92. The pole compensation is used to cancel the lag time response found in the system response in block 96. The lag time response is that time from a rate of change of the cooling rate of the cooling device before affecting the component temperature. For an exemplary system, this lag time, D, was empirically found to be 100 seconds, thus creating a system response with a pole of $1/(100s+1)$. The pole compensation is accordingly $100s+1$. Including an integration term of $1/s$ and a gain K, the desired compensated response is then $G(s)=K(100s+1)/s$. A more general compensated response equation where D is the system response lag time is $G(s)-K(Ds+1)/s$. The compensated output from block 92 is then used to control the cooling system dynamics. For an exemplary embodiment using a fan, this would entail changing the speed of the fan that causes an empirically measured response of −12 degrees Celsius per volt applied to the fan. Controlling the cooling system dynamics changes the cooling rate of the cooling device. The amount of which the cooling rate varies is the rate of change of the cooling rate of the cooling device. The cooling device is thermally coupled through the heat dissipation structure 50 (see FIGS. 1 and 2) to affect the component temperature of the heat producing component 20. The component temperature with respect to a change of the cooling rate of the cooling device is the system response shown in block 96.

Figure 3B:
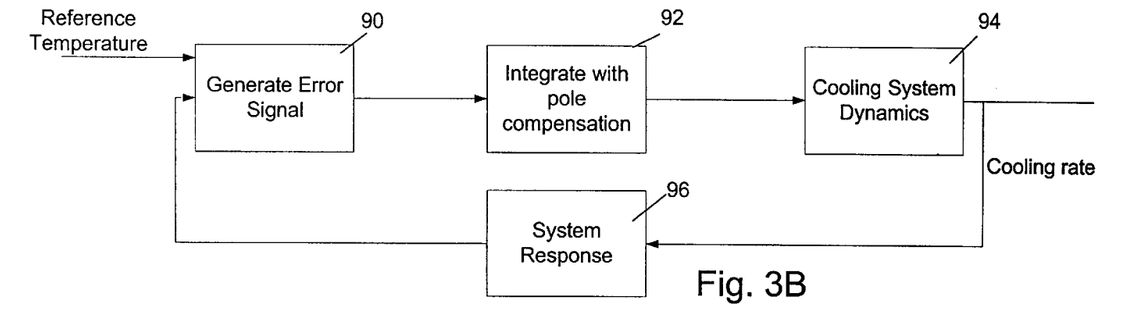
FIG. 3B is a system control diagram in the z-domain of the control diagram in FIG. 3A.

FIG. 3B illustrates the conversion of the s-domain integration with pole compensation transfer function shown in block 92, $G(s)=K(Ds+1)/s$, into the z-domain and then the time sampled domain using the bilinear s to z transform $s=(2/T)(1-z^{-1})/(1+z^{-1})$ where T=sample period. Simplifying $G(s)$ gives $G(s)=DK+K/s$. Then $G(z)=DK+KT(1+z^{-1})/2(1-z^{-1})$.

Figure 3C:
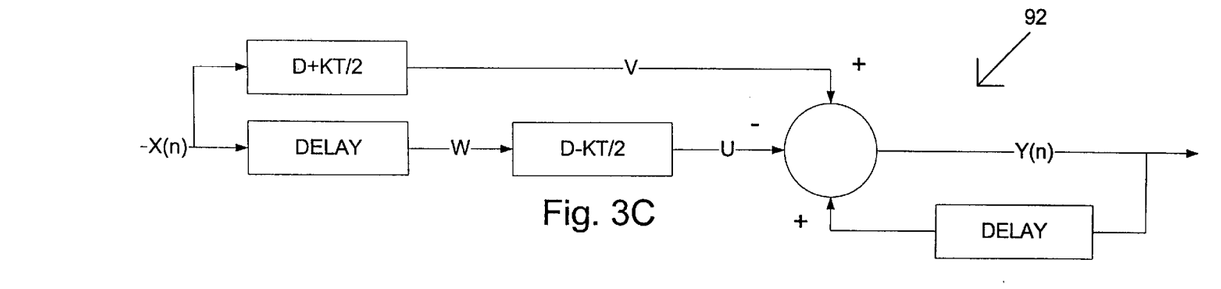
FIG. 3C is a time domain diagram of the integrator with system pole compensation filter of FIG. 3B.

FIG. 3C illustrates the time domain block diagram after conversion from the z-domain of the integrator with pole compensation block 92 of FIG. 3B. Simplifying and converting to the sampled domain yields the resulting difference equation where x(n) is the sampled input and y(n) is the sampled output of block 92, $y(n)=y(n-1)+(DK+KT/2)x(n)-(DK-KT/2) \times (n-1)$. This difference equation is implementable as a software subroutine. For an exemplary implementation where D-equals 100 seconds, then T, the sample period, should be at least 10 times smaller than D to allow the bilinear s to z transform to closely approximate the s-domain response. Therefore, for a system lag time of 100 seconds, the temperature should be sampled at least once every 10 seconds and preferably at least once a second.

Figure 3D:
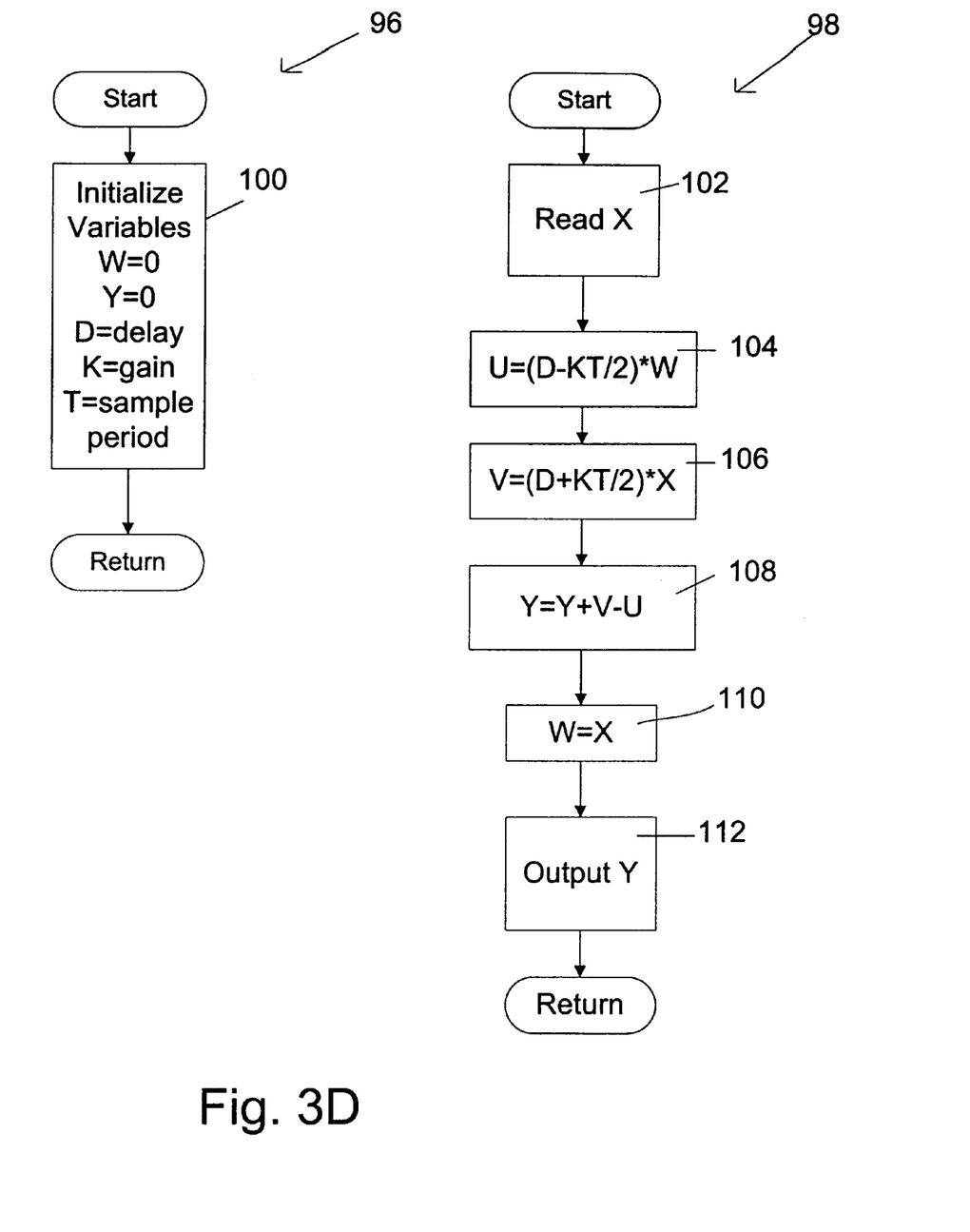
FIG. 3D is a set of software subroutine flowcharts illustrating the execution of the integrator with system pole compensation filter of FIG. 3C.

FIG. 3D illustrates flow charts of an exemplary subroutines used to implement the difference equation illustrated in block diagram form in FIG. 3C. In a first initialization subroutine 96, block 100 initializes the variables W (x(n−1)) to zero, Y (the output value) to zero. The lag time of the system, D, is set to the predetermined delay found for the system, and the gain, K, is initialized to that required by the various parameters of the system, in particular, the error signal response and the cooling system dynamics. The sampling period, T, is set to the time used to sample the input and output. A second subroutine 98 is then called each sample period (an exemplary period being once per second) to sample and read the input X in block 102, which is the error signal from block 90 in FIG. 3B. The proportional integral control is computed in block 104, block 106, and block 108. This sequence of equations computes the difference equations that not only integrates the input but also provides for the pole compensation due to the system response lag time delay. In block 110, the input value X is stored in W to save the previous sample for the next computation of the difference equation. Finally, in block 112, the compensated output Y is output. Since the compensated output Y is a digital value, it preferably is converted to an analog output in order to drive the cooling device 30 (FIG. 2).

When the digital signal is converted to an analog signal, quantization noise is introduced onto the compensated signal. Depending on the type of cooling device and the resolution of the digital to analog conversion, this quantization noise may introduce audible noise onto the cooling device. In an exemplary embodiment using a fan, a steep change from one quantization step to another each sampling period my be objectionable to users of the electronic device. Therefore, it is preferable to add a quantization noise filter after the digital to analog conversion to reduce this noise.

In embodiments where it is desirable to keep the cost of the control circuitry to a minimum, it is preferable to use a simple microprocessor such as a microcontroller that uses only a single digital output to perform the digital to analog conversion. Two techniques which address this need are pulse-width modulation and delta-sigma modulation.

In pulse-width modulation, the desired output is based on a percentage of the full-scale output voltage which for a typical VCC=5Volt system is 5 volts. The percentage is determined by the width of the time period that the digital output is held at a "one" state or 5 volts divided by the total time period used. Thus the quantization noise for a pulse-width modulated signal is determined by the ability of the microprocessor to control the width of the pulse. If the output period is every 1-second, then if the microcontroller updates the output every one-tenth second, then the quantization noise is on the order of ½ of one tenth of 5 volts or 0.25 volts. The output depending on the cooling device used may need to be filtered and a low pass filter, preferably a simple RC circuit to minimize cost, is added to the output. To allow the output to settle sufficiently, the time constant of the low pass filter is preferably at least 5 times the time period used to generate the pulse-width modulated output. This low pass filter adds additional delay to the system response and should be compensated for in the proportional integral filter circuit. One method of reducing the delay introduced in to increase the frequency of the pulse-width modulated signal by decreasing the time period of the output. However, decreasing the time period of the pulse-width modulated output requires either reducing the resolution of the output, thereby increasing the quantization noise, or increasing the computational load on the microprocessor which often is also being used for other tasks.

An alternative approach is to use a delta-sigma modulated output. A delta-sigma modulated output feeds back the output signal with the quantization error and subtracts it from the input. This approach causes the quantization error to be shifted to higher frequencies, thus allowing it to be removed with a low pass filter having a smaller RC time constant than the PWM low pass filter. The key to this approach is to oversample the input voltage. For the exemplary sample period of once per second for the compensated output, an oversampling period of once per hundredth of a second is easily achievable with standard embedded microprocessors.

Figure 4A:
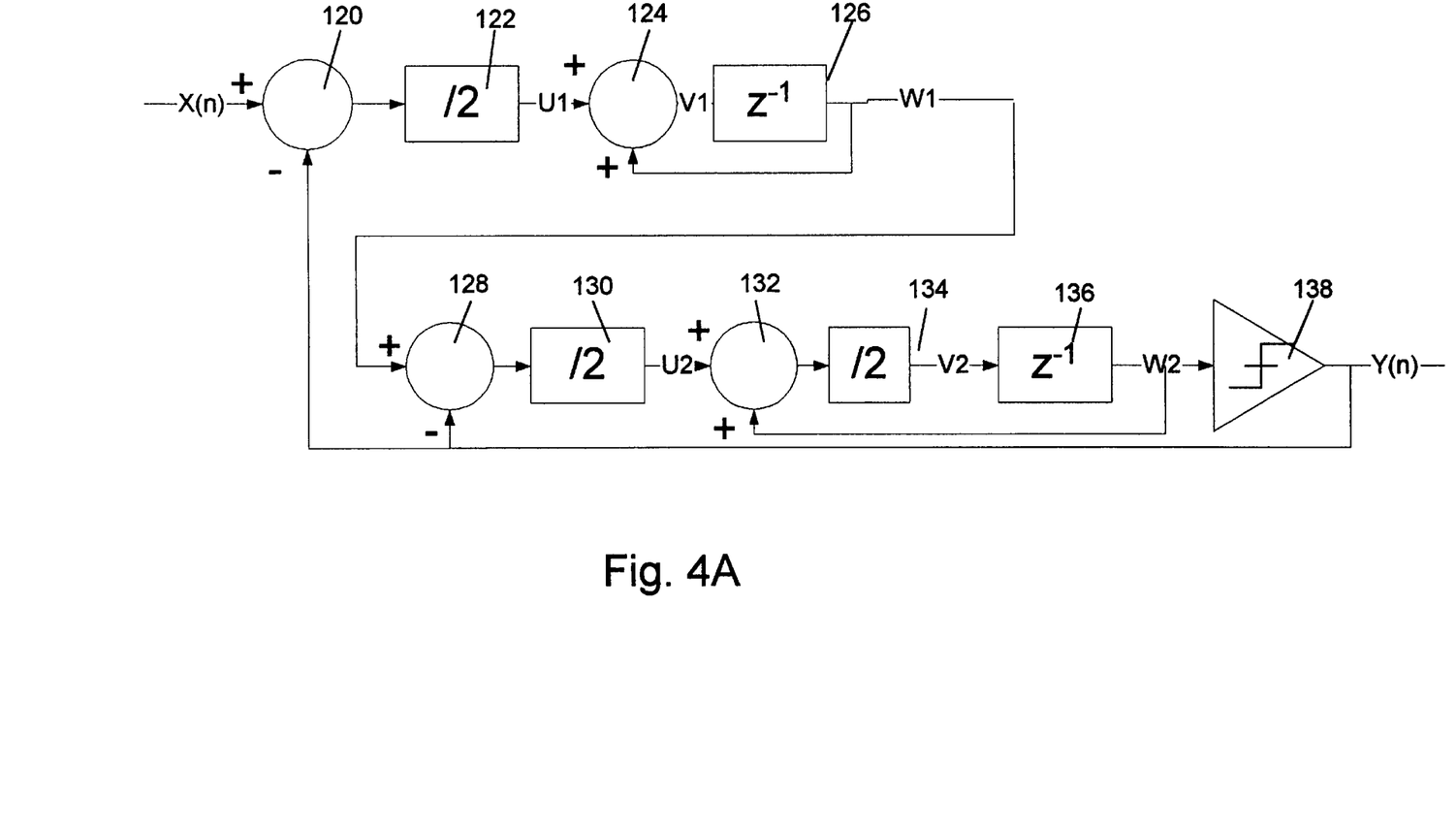
FIG. 4A is a system diagram for a second order delta-sigma modulator.

FIG. 4A is a block diagram of a second-order delta-sigma modulator that is optimized to work with two's compliment integer shift, add, and subtract operations found on all microprocessors and embedded microcontrollers. The output y(n) is a single bit output. To prevent overflow, the integer value representing the output is restricted to a value less than the full scale output. Thus block 138 is a comparator operation which sets the output "high" or "low" but for the calculations sets the output y(n) either to a 0 valued integer or an integer that is less than full scale. An exemplary output value for an +/−127 (8 bit integer math) would be to let a "high" output equal 5V which is represented as the integer 80; a "low" output would equal 0V which is represented as the integer 0.

Block 120 subtracts the input x(n) from the output y(n). Block 122 then shifts the result right to divide by two to prevent overflow. The result from block 122 is labeled the variable U1. Blocks 124 and 126 form a first stage integrator where block 124 is an addition operation and block 126 is a delay element. The result of block 124 is labeled the variable V1 and the result of block 126 is labeled the variable W1. The output y(n) is then subtracted from the output of block 126 in block 128 and then shifted right to divide by 2 in block 130 to prevent overflow. The result of block 130 is labeled the variable U2. Blocks 132, 134 and 136 form a second integrator where block 132 provides an addition operation, block 134 a shift right operation to divide by two to prevent overflow, and block 136 a delay element. The output of block 134 is labeled the variable V2 and the output of block 136 is labeled the variable W2. Because block 138 performs a comparator operation, the reduction of gain due to block 134 does not require additional compensation as any error is feed back to the input. The output of block 136 is then compared in block 138 with zero to determine if the output y(n) should change values as previously described.

Figure 4B:
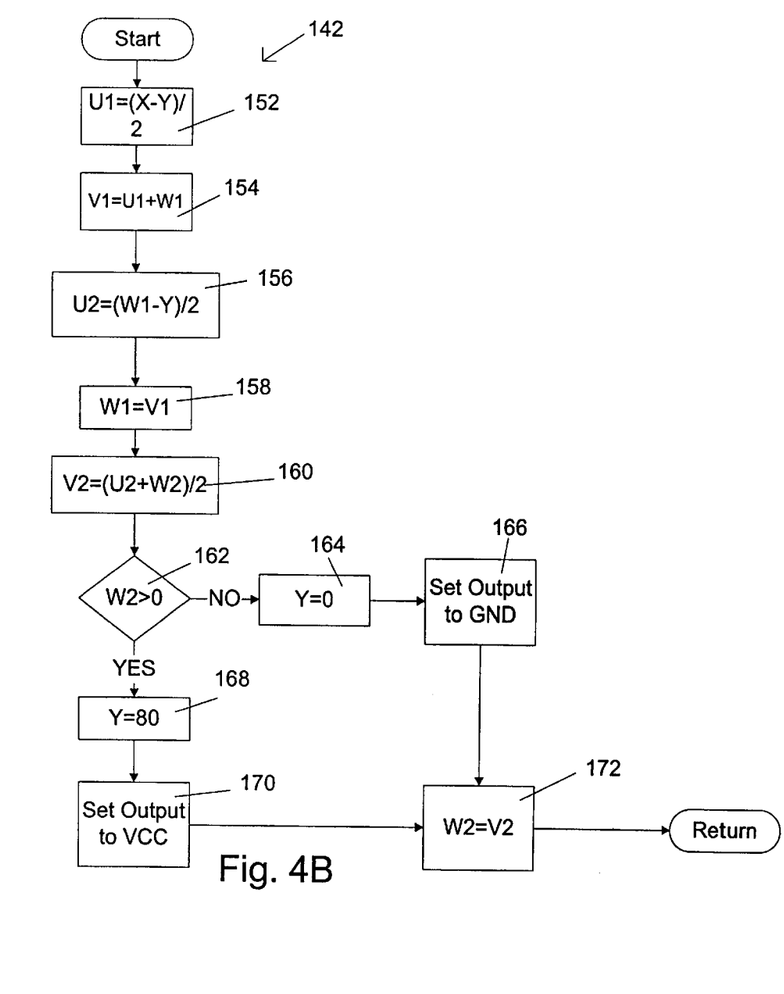
FIG. 4B is a set of software subroutine flowcharts used to execute the delta-sigma modulator of FIG. 4A.

FIG. 4B is a set of flow charts of subroutines used to implement the second order delta-sigma modulator described in FIG. 4A for the exemplary output using 8 bit two's compliment integer math. A first subroutine 140 is used to initialize the variables that require a past state. Thus in block 150, Y(y(n)) is set to zero, as is W1 and W2, the outputs of the integrators. X(x(n)) is passed to the update routine 142, which includes blocks 152 through blocks 172. This update routine 142 is called each oversampled period, e.g. once every one-hundredth second for the exemplary implementation described. In block 152, U1 is created by subtracting the input X from the output Y and then shifted right to divide by 2. In block 154, the previous output of the first integrator, W1 is added to U1 to form the variable V1. In block 156, the output Y is subtracted from the previous output of the first integrator W1 and the result right shifted to divide by 2 to form the variable U2. In block 158, saving the value of V1 in the variable W1 performs the delay operation in block 126 of FIG. 4A. In block 160, the previous output of the second integrator W2 is added to the variable U2 and right shifted to divide by two to form the variable V2. The previous value of the output of the second integrator W2 is then checked in decision block 162 to see if it is greater than zero. If it is not then the output variable Y is set to the value 0 in block 164 and the actual output pin is set to GND or 0 volts in block 166. Then in block 172, before returning from the update routine 142, saving the value of V2 in the variable W2 performs the delay operation in block 136 of FIG. 4A. If W2 in block 162 is greater than zero, then in block 168, the output variable Y is set to the integer value used to represent a "high" output, which in the exemplary case is 80. In block 170, the output pin is set to VCC or 5 volts in the exemplary case. Then in block 172, before returning from the update routine 142, saving the value of V2 in the variable W2 performs the delay operation in block 136 of FIG. 4A.

Figure 5A:
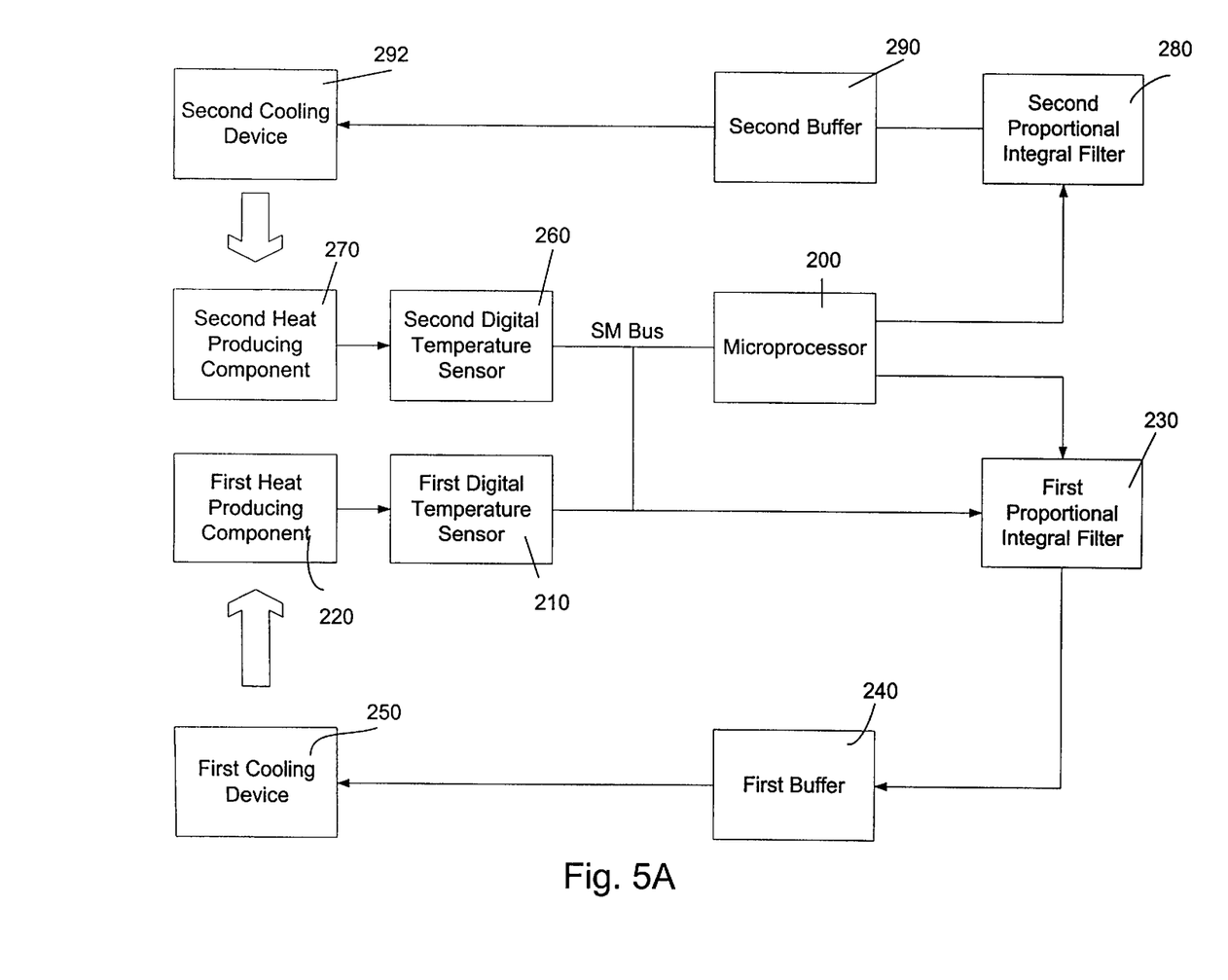
FIG. 5A is a block diagram of an alternative embodiment of the invention.

FIG. 5A is a block diagram of an exemplary alternative embodiment of a proportional integral cooling system having two heat producing components, each requiring proportional integral control. An exemplary system is a notebook computer having a high speed microprocessor module as a first heat producing component 220 and a high speed 3D graphics controller module as a second heat producing component 270 both of which require tight thermal control for reliable operation. Further, the microprocessor module is interchangeable with different models, each having a different lag system response time. Microprocessor 200 is used to read from a first digital temperature sensor 210 the component temperature of the first heat producing component 220. The microprocessor 200 also communicates to a second digital temperature sensor 260 to read the component temperature of the second heat producing component 270. Communication between the microprocessor 200 and the temperature sensors is shared using an industry standard system management bus (SMBus). In this exemplary alternative embodiment, the microprocessor is also used to perform several other tasks in the system so it has limits on the additional computational load it takes on. Therefore, the microprocessor 200 only performs scaling, differencing with a reference temperature, alarm management, and D/A conversion. A first proportional integral filter 230 which is made up of analog circuitry is used to process the D/A signal from the microprocessor 200 to compensate for the lag time delay in response for the first heat producing component 220. The output of the first proportional integral filter 230 is connected to a first buffer 240 which provides the proper current drive and voltage levels to a first cooling device 250. First cooling device 250 provides the cooling of first heat producing component 220. First heat producing component 220 may not have a 20 heat dissipation structure attached to it but preferably, it would. Alternatively, the heat dissipation structure may be incorporated into the component packaging. Microprocessor 200 is also connected to the first proportional integral filter 230 using the SMBus to change the system response parameters of the first proportional integral filter. The first proportional integral filter 230 also incorporates the quantization noise filter to reduce audio noise caused by abrupt changes in the D/A output from microprocessor 200.

Microprocessor 200 also performs the necessary scaling, differencing with a reference temperature, alarm management, and D/A conversion for the second digital temperature sensor 260. The D/A output from the microprocessor 200 for the second heat producing component 270 is connected to a second proportional integral filter 280 which is also an analog based filter in order to reduce the computational load on microprocessor 200. The output of the second proportional integral filter is connected to a second buffer that provides the proper current and voltage levels to a second cooling device 292. Second cooling device 292 provides the cooling of second heat producing component 270.

Figure 5B:
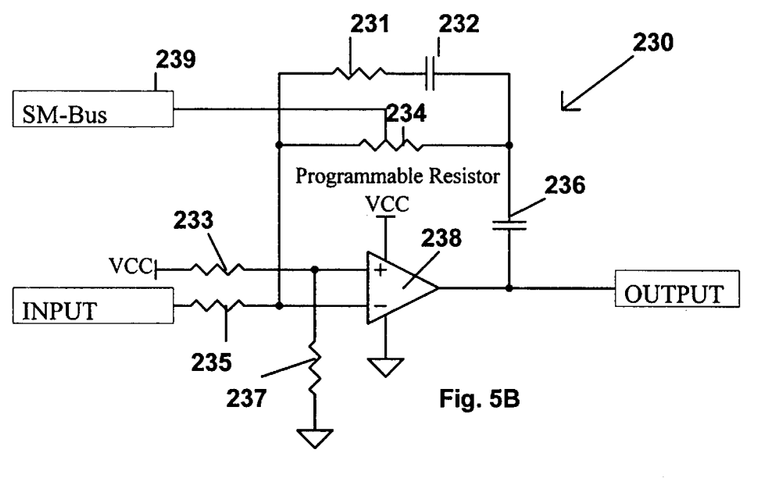
FIG. 5B is an exemplary circuit for the first proportional integral filter shown in FIG. 5A.

FIG. 5B is an exemplary embodiment of the first analog proportional integral filter 230. Resistors 233 and 237 provide voltage biasing for opamp 238, which in this exemplary embodiment is preferably a LM6482 style opamp. Resistors 235 and 234 provide the gain K, while the time constant of resistor 234 and capacitor 236 provides the system pole compensation delay D. Resistor 231 and capacitor 232 provide a quantization filter by reducing the gain K at high frequencies. Resistor 234 is shown as an electrically programmable variable resistor that is connected to the SMBus to allow the microprocessor 200 of FIG. 5A to adjust the system pole compensation delay D. Adjusting the system pole compensation delay D will also affect the gain, so the gain setting should be chosen high enough to work for all anticipated cases. Alternatively, the resistor 235 could also be made programmable or a different opamp circuit could be used to separate out the gain and delay components. Several different methods for implementing the pole compensation network with opamps are known to those skilled in the art.

Figure 5C:
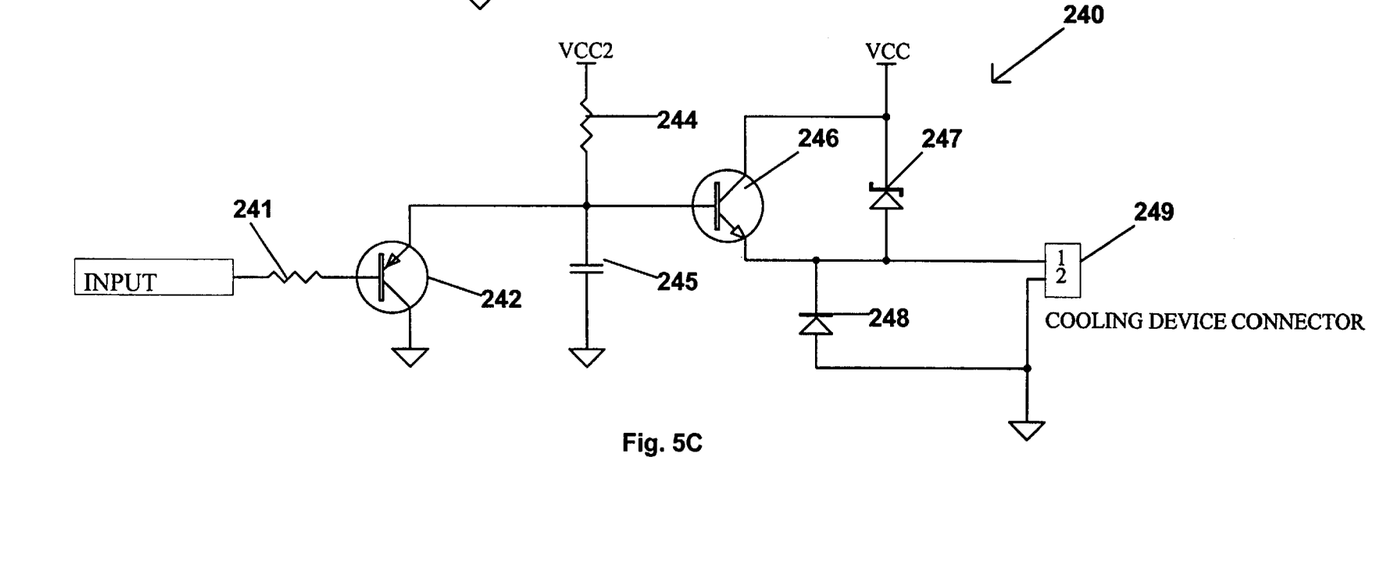
FIG. 5C is an exemplary circuit for the first buffer shown in FIG. 5A.

FIG. 5C is an exemplary implementation of first buffer 240 that is used to current buffer the output of the opamp 238. Resistor 241, and transistor 242 along with resistor 244 and capacitor 245 provide voltage level translation. This translation ensures that the current buffer 246 is able to drive as close to the power rail VCC as possible when VCC2 is a larger voltage than VCC. Diodes 247 and 248 provide protection to current buffer 246 when driving an inductive load such as a fan or voice coil. Current buffer 246 is connected to connector 249 which further connects to the first cooling device 250 in FIG. 5A.

In order to rapidly adapt to customer needs, electronic devices, such as computers, are built using what is called a postponement process. Major device selections such as processor speed, memory size, mass storage devices, and the like are not installed in a platform (the electronic device) until a customer order is received. Depending on the actual configuration, the system response shown in block 96 of FIG. 3A is likely different from unit to unit.

Further, the use of mobile computers in both remote and docked configurations, changes the system response lag time due to either operating at different clocks speeds, changes in the ability to vent air from the device when docked, or the use of additional cooling devices provided by the dock station.

Figure 6:
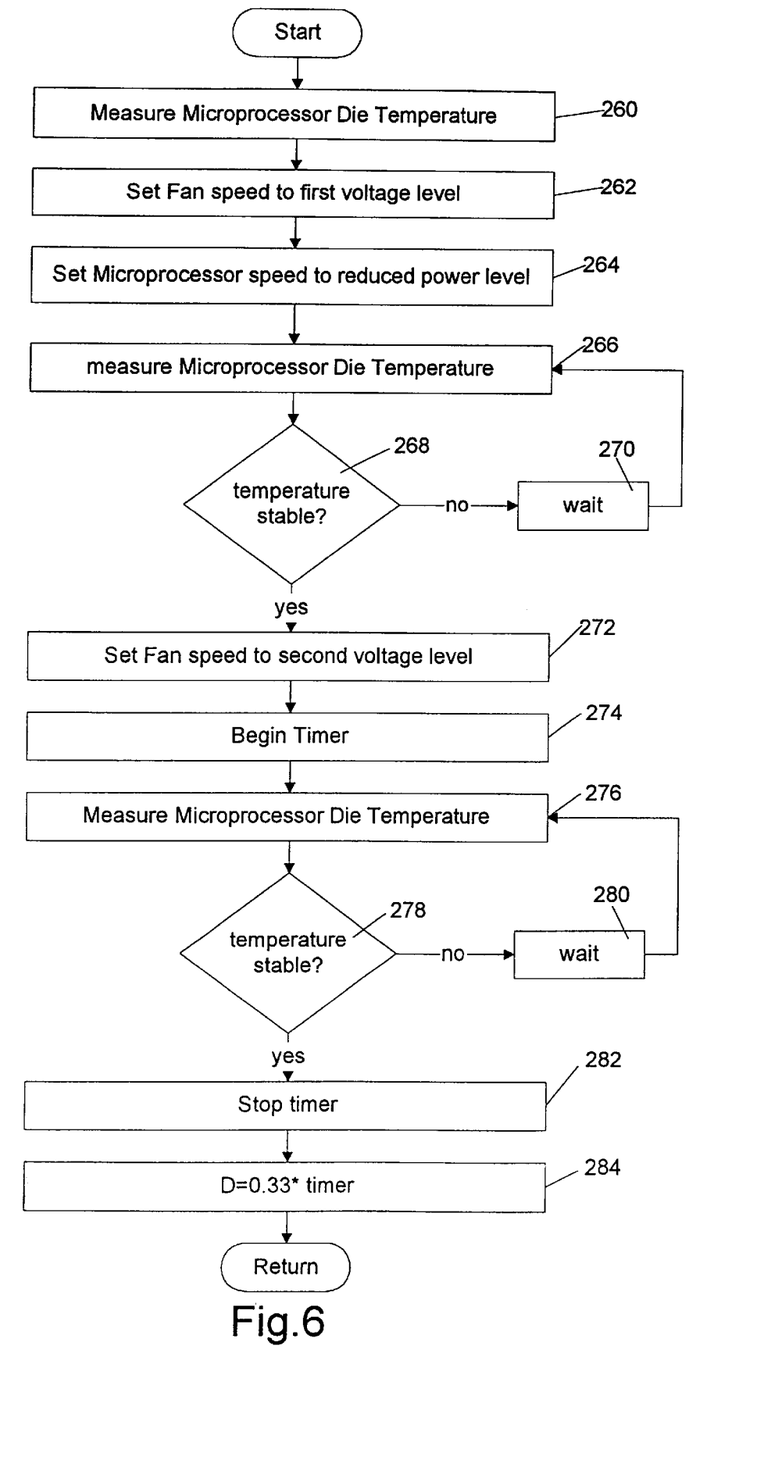
FIG. 6 is a flowchart of a software subroutine that is used to allow the control circuit in FIG. 2 to adapt to the measured system response time of the electronic device.

One method used by the invention to account for this unpredictable system response is to make the control circuitry adaptable to the actual system response. FIG. 6 is a flow chart of an exemplary adaptive subroutine in computer readable memory 61 and executed by microprocessor 60 (see FIG. 2). In this example, heat producing component 20 is a central processing unit (CPU) such as a Pentium III device made by Intel. In block 260, the CPU's die temperature is read by the control circuitry. In block 262, the cooling device 30, which is a fan in this example, is set to a predetermined fan speed by applying a first voltage level to the fan. Next, in block 264, the CPU speed is set to a reduced power level (e.g. ½) to ensure that the CPU is operating within the control region of the control circuitry. In blocks 266, 268, and 270, the CPU's die temperature is read until it has stabilized for the first voltage level fan speed. Then in block 272, the fan speed is set to a second voltage level, its maximum setting. In block 274 a timer is started to begin measuring the time for the CPU's die temperature to become stable again. This temperature stabilization test is performed by blocks 276, 278, and 280. Once the CPU die temperature has stabilized, the timer is stopped. The system response, D, is then approximately one-third of the time indicated by the timer. The system response is then used by subroutine 98 shown in FIG. 3C. Alternatively, the control circuit can use the system response, D, to set the correspondingly appropriate resistor value for programmable resistor 234 in FIG. 5B.

The adaptive subroutine illustrated in FIG. 6 is preferably run as part of a system diagnostic test suite due to the long time period required for most systems to stabilize. However, it is envisioned that the adaptive subroutine can be incorporated into a power management BIOS such as ACPI, which is a computer industry supported specification that allows for an advanced control and power interface of a computer system.

Accordingly, the invention provides several improvements over the existing thermal solutions. The invention is able to incorporate digital temperature readings into a proportional integral filter having pole compensation. Further, multiple temperature sensing devices can be used to further refine the type of control used to cool heat producing components. Multiple control of several heat producing components can be controlled with single microprocessor acting as a portion of the control circuitry. In addition, the use of pulse-width modulation or delta-sigma modulation by the microprocessor allows for low cost implementation. The addition of a quantization noise filter, proportional control of the cooling device, and incorporation of non-air moving cooling devices help to minimize the audible noise heard by users of an electronic device incorporating the invention. The versatility of using a microprocessor as the control circuit allows system designers flexibility in deciding which portion of the invention to implement as software subroutines or separately with discrete analog components. Several different cooling devices can be used with the invention in addition to being able to support multiple cooling devices.

Further, the ability to adapt to the actual system response, allows the control circuitry to respond to differing cooling situations such as in mobile/dock configurations or to support the postponement of several different system configurations.

What is claimed is:
1. An electronic device, comprising:
   a heat producing component having a component temperature;
   a cooling device having a cooling rate and a rate of change of the cooling rate;
   a temperature sensor for sensing the component temperature of said heat producing component;
   a heat dissipation structure thermally coupled to said heat producing component and to said cooling device, wherein said component temperature exhibits a lag time from said rate of change of the cooling rate of said cooling device; and
   control circuitry connected to said temperature sensor and said cooling device, said control circuitry varying the cooling rate in a manner which cancels out the lag time during a change from a steady state condition of the component temperature, wherein during the steady state condition of the component temperature, the cooling rate of said cooling device varies in proportion to variation in sensed component temperature.

2. The electronic device of claim 1, further comprising:

a case having a local environment temperature substantially affected by thermal radiation from said heat dissipation structure and said cooling device;

an additional temperature sensor for sensing the local environment temperature, said additional temperature sensor connected to said control circuitry; and wherein said control circuitry incorporates said additional temperature sensor into varying the cooling rate.

3. The electronic device of claim 1, wherein said temperature sensor comprises a digital output.

4. The electronic device of claim 1, wherein said control circuitry comprises a microprocessor.

5. The electronic device of claim 1, wherein said heat producing component is an integrated circuit having a die surface and wherein said component temperature is measured on the die surface.

6. The electronic device of claim 1, wherein said control circuitry comprises a digital to analog converter.

7. The electronic device of claim 6, wherein said digital to analog converter comprises a quantization error filter.

8. The electronic device of claim 1, wherein said control circuitry comprises means for detecting said lag time and thereafter incorporating the detected lag time in said control circuitry.

9. A method for controlling the component temperature of a heat producing component with a cooling device, the component temperature exhibiting a lag time in response from a rate of change of a cooling rate of the cooling device, the method comprising the steps of:

detecting the difference between the temperature of the heat producing component and a reference temperature, thereby creating a difference temperature;

filtering the difference temperature to compensate for said lag time thereby creating a compensated signal; and controlling the cooling device with said compensated signal wherein during a steady state condition of the component temperature, the rate of change of the cooling rate of the cooling device varies in proportion to sensed component temperature.

10. The method of claim 9, wherein the step of detecting further comprises the steps of:

sampling the heat producing component with a digital thermistor thereby creating a digital reading, and subtracting the reference temperature from said digital reading thereby creating said difference temperature.

11. The method of claim 9, wherein the step of filtering further comprises the step of digitally filtering said difference temperature with a microprocessor.

12. The method of claim 11, wherein the step of digitally filtering further comprises the steps of:

detecting the lag time in response from the rate of change of the cooling rate of the cooling device thereby creating a detected lag time; and incorporating said detected lag time into said step of digitally filtering.

13. The method of claim 11, wherein the step of digitally filtering further comprises the step of filtering quantization noise from said compensated signal.

14. The method of claim 13, wherein the step of filtering quantization noise further comprises the step of delta-sigma modulating said compensated signal.

15. The method of claim 9, wherein the heat producing component includes a heat dissipation structure thermally coupled to the heat producing component, the method further comprising the steps of:

reading the temperature of the heat dissipation structure thereby creating a structure temperature; and incorporating the structure temperature into the step of controlling the cooling device.

16. The method of claim 15, wherein the step of incorporating the structure temperature further comprises using the structure temperature for the reference temperature.

17. The method of claim 16, wherein the step of incorporating the structure temperature further comprises the steps of:

determining if the structure temperature has exceed a predetermined limit; and if so alerting that the structure temperature has exceeded the predetermined limit.

18. The method of claim 17, wherein the step of alerting further comprises the step of enabling a second cooling device, the second cooling device thermally coupled to said heat producing component.

19. An electronic device having a control circuit using the method of claim 9, the electronic device further comprising:

at least one heat producing component having a temperature sensor coupled to the control circuit; and at least one cooling device thermally coupled to said heat producing component and electrically coupled to the control circuit.

20. An apparatus for cooling a heat producing component with a cooling device using the method of claim 9.

* * * * *